US006577058B2

(12) United States Patent
Ossipov et al.

(10) Patent No.: US 6,577,058 B2
(45) Date of Patent: Jun. 10, 2003

(54) INJECTION COLD EMITTER WITH NEGATIVE ELECTRON AFFINITY BASED ON WIDE-GAP SEMICONDUCTOR STRUCTURE WITH CONTROLLING BASE

(75) Inventors: Viatcheslav V. Ossipov, Madrid (ES); Alexandre M. Bratkovski, Mountain View, CA (US); Henryk Birecki, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 09/974,818

(22) Filed: Oct. 12, 2001

(65) Prior Publication Data

US 2003/0071554 A1 Apr. 17, 2003

(51) Int. Cl.[7] .............................. H01L 29/12; H01J 1/05

(52) U.S. Cl. ........................ 313/499; 313/310; 313/311; 257/10; 257/11

(58) Field of Search ................................. 313/310, 311, 313/346 R, 495, 499, 346 DC, 309, 351; 257/10, 11, 101, 102, 607

(56) References Cited

U.S. PATENT DOCUMENTS

| | | | | |
|---|---|---|---|---|
| 3,699,404 A | * 10/1972 | Simon et al. | 317/235 R |
| 4,119,994 A | * 10/1978 | Jain et al. | 357/16 |
| 4,683,399 A | * 7/1987 | Soclof | 313/537 |
| 5,031,015 A | * 7/1991 | Miyawaki | 357/16 |
| 5,202,571 A | * 4/1993 | Hirabashi et al. | 257/10 |
| 5,285,079 A | * 2/1994 | Tsukamoto et al. | 257/10 |
| 5,550,435 A | * 8/1996 | Kuriyama et al. | 315/169.1 |
| 5,557,596 A | 9/1996 | Gibson et al. | 369/101 |
| 5,599,749 A | 2/1997 | Hattori et al. | 437/228 |
| 5,619,092 A | 4/1997 | Jaskie | 313/309 |
| 5,838,019 A | * 11/1998 | Tsukamoto et al. | 257/10 |
| 5,908,699 A | 6/1999 | Kim | 428/408 |
| 5,932,962 A | 8/1999 | Nakatani et al. | 313/495 |
| 5,945,777 A | * 8/1999 | Janning et al. | 313/310 |
| 6,187,603 B1 | 2/2001 | Haven et al. | 438/20 |
| 6,204,595 B1 | 3/2001 | Falabella | 313/308 |

OTHER PUBLICATIONS

G.G.P. van Gorkom et al., "Performance of Silicon Cold Cathodes", Sep. 30, 1985, J. Vac. Sci. Technol. B 4(1), Jan./Feb. 1986, pp. 108–111.

A.M.E. Hoeberechts et al., "Design, Technology, and Behavior of a Silicon Avalanche Cathode", Oct. 8, 1985, J. Vac. Sci. Technol. B 4(1), Jan./Feb. 1986, pp. 105–107.

E.A. Hijzen et al., "Avalanche Cold Cathodes with 10% Emission Efficiency", Sep. 8–10, 1988, ESSDERC'98 Proceedings of the 28th European Solid–State Device Research Conference, pp. 584–587.

Yokoo et al., "Experiments of highly emissive metal–oxide–semiconductor electron tunneling cathode", May/Jun. 1996,J. Vac. Sci. Technol. B 14(3), 1996 American Vacuum Society, pp. 2096–2099.

(List continued on next page.)

*Primary Examiner*—Ashok Patel

(57) ABSTRACT

A cold electron emitter may include a heavily n+ doped wide band gap (WBG) substrate, a p-doped WBG region, and a low work function metallic layer ($n^+$-p-M structure). A modification of this structure includes heavily p+ doped region between p region and M metallic layer ($n^+$-p-p+-M structure). These structures make it possible to combine high current emission with stable (durable) operation. The high current density is possible because the p-doped (or p+ heavily doped) WBG region acts as a negative electron affinity material when in contact with low work function metals. The injection emitters with the $n^+$-p-M and $n^+$-p-p+-M structures are stable since the emitters make use of relatively low extracting electric field and are not affected by contamination and/or absorption from accelerated ions. In addition, the structures may be fabricated with current state-of-the-art technology.

28 Claims, 6 Drawing Sheets

OTHER PUBLICATIONS

Akinwande, A.I. et al., "GaN Solid State Electron Emitter", Technical Digest of IVMC'97, Kyongiu, Korea 1997, pp. 602–607.

Lee, W.S. et al., "A Study of the Diamond Cold Cathode in FED", Asia Display 98, pp. 681–684.

Komoda et al., "Mechanism of efficient and stable surface–emitting cold cathode based on porous polycrystalline silicon films", May/Jun. 1999, J. Vac. Sci. Technol. B 17(3), 1999 American Vacuum Society, pp. 1076–1079.

* cited by examiner

INJECTION COLD EMITTER WITH NEGATIVE ELECTRON AFFINITY BASED ON WIDE-GAP SEMICONDUCTOR STRUCTURE WITH CONTROLLING BASE

RELATED APPLICATIONS

The following application of the common assignee, which is hereby incorporated by reference in its entirety, may contain some common disclosure and may relate to the present invention:

U.S. patent application Ser. No. 09/975,297, entitled "High-Current Avalanche-Tunneling And Injection-Tunneling Semiconductor-Dielectric-Metal Stable Cold Emitter Which Emulates The Negative Electron Affinity Mechanism Of Emission".

FIELD OF THE INVENTION

This invention relates generally to electron emitters. In particular, the invention relates generally to cold electron emitters of p-n cathode type.

BACKGROUND OF THE INVENTION

Electron emission technology exists in many forms today. Hot cathode ray tubes (CRT), where electrons are produces as a result of thermal emission from hot cathode heated by electrical current, are prevalent in many displays such as televisions (TV) and computer monitors. Electron emission also plays a critical role in devices such as x-ray machines and electron microscopes. Miniature cold cathodes may be used for integrated circuits and flat display units. In addition, high-current density emitted electrons may be used to sputter or melt some materials.

In general, two types of electron emitters exist—"hot" and "cold" cathode emitters. The "hot" cathodes are based on thermal electron emission from surface heated by electric current. The cold cathodes can be subdivided into two different types: type A and B. The emitters of type A are based on the field emission effect (field-emission cathodes). The emitters of type B are the p-n cathodes using the emission of non-equilibrium electrons generated by injection or avalanche electrical breakdown processes.

Both types of emitters have drawbacks which make them virtually impractical. For type A emitters (field emission type), one of the main drawbacks is their very short lifetime. For example, the type A emitters may be operational for just hours, and perhaps even as short as minutes. In the cold field-emission cathodes (type A), electrons are extracted from the surface of a metal electrode by a strong electric field in vacuum. The field cathodes have a short lifetime at large emitted currents, which are needed in recording devices and other applications.

With reference to FIG. 1A, operation of type A emitters will be described. FIG. 1A illustrates a typical energy diagram for a metallic surface illustrating a concept of a work function of a metal. As shown, a material, in this instance a metal, is on the left and a vacuum region is on the right. $E_F$ represents a Fermi level of the metal. The work function of the metal $\Phi_M$ is the energy required to move a single electron from the Fermi level in the metal into vacuum. Thus, the work function $\Phi_M$ is the difference between Vac and $E_F$. The work function $\Phi_M$ for metal is typically between 4–5 electron volts (eV).

In very strong external field the energy diagram changes, and it looks as a triangular potential barrier for the electrons (FIG. 1A, dashed line). When the external field F increases, the barrier width decreases and the tunneling probability for electrons rapidly increases. The transparency of such a barrier is $$D = \exp\left[-\frac{4\Phi_M^{3/2}\sqrt{2m}}{3qhF}\right],$$

where F the electric field, q and m are the electron charge and mass. Transparency represents the probability of electron tunneling. For current densities j=1–100 A/cm$^2$ (amperes per square centimeter) the corresponding field would be F>10$^7$ V/cm.

In such strong fields, the ions, which are always present in a vacuum region in actual devices, acquire the energy over 10$^3$ eV in the vacuum region on the order of one micron or larger. Ions with such strong energies collide with the emitter surface leading to absorption of the ions and erosion of the emitter surface. The ion absorption and erosion typically limits the lifetime of type A emitters to a few hours of operation or even to a few minutes. Damage to cathodes in systems with the fields of similar strength has been studied in great detail and is rather dramatic.

For type B emitters (injection/avalanche type), one of the main drawbacks is that the efficiency is very small. In other words, the ratio of emitted current to the total current in the circuit is very low, usually much less than 1%. The cathode of type B based either on p-n junctions, or semiconductor-metal (S-M) junction including $TiO_2$ or porous Si, or the avalanche electrical breakdown need an "internal" bias, applied to p-n junction or S-M junction.

Alternatively, there have been suggestions to use the electrical breakdown processes to manufacture the cold emitters from Si. These types of avalanche emitters are based on emission of very hot electrons (with energies of the order of a few electron volts) accelerated by very strong electric field in the avalanche regime. As a result, they also have a disadvantage that the emitted current density of the hot electrons is very small.

Attempts have been made to increase the current density by depositing cesium (Cs) on semiconductor surface to use a negative electron affinity (NEA) effect. FIG. 1B illustrates the concept of NEA. As shown, a material, a p-type semiconductor in this instance, is on the left and a vacuum region is on the right. $E_C$ represents a conduction band of the metal. Note that the NEA effect corresponds to a situation when the bottom of the conduction band $E_C$ lies above the vacuum level Vac. One earlier p-n cathode of this type combined a silicon, or gallium arsenide avalanche region, with cesium metallic layer from where the emission took place (GaAs/Cs or GaP/Cs structures). However, Cs is a very reactive and volatile element. Thus, the GaAs and GaP emitters with Cs are not stable at high current densities.

In short, cold emitters with both high current emission and stability were not possible with previous designs.

SUMMARY OF THE INVENTION

In one respect, an embodiment of a cold electron emitter may include an heavily doped n-type region (n+ region). The n+ region may be formed from wide band gap semiconductors. The electron emitter may also include a substrate below the n+ region. Indeed, the n+ region may be formed by doping the substrate with electron rich materials. In addition, the electron emitter may include a p region formed within or above the n+ region. The p region may be formed by counter doping the n+ region with electron poor materials. The thickness of the p region is preferred to be less than the diffusion length of the electrons in the p region. Also, the hole concentration level in the p region is preferred to be less than the electron concentration in the n+ region. The electron emitter may further include a metallic layer formed above the p region. The work function of the metallic layer is preferred to be less than the energy gap of the p region. In addition, the thickness of the metallic layer is preferred to be on the order of or less than the mean free path for electron energy. The electron emitter may still further include a heavily doped p region (p+ region) formed within the p region, for example, by delta-doping the p region. The electron emitter may yet further include n and p electrodes so that n+-p junction may be forward biased for operation, for example, to control the amount of current emitted from the device. The electron emitter may still yet further include an M electrode, with or without the p electrode.

In another respect, an embodiment of a method to fabricate an electron emitter may include forming an n+ region, for example, from doping a wide band gap substrate with electron rich materials. The method may also include forming a p region within the n+ region, for example, by counter doping the n+ region with electron poor materials. The thickness of the p region is preferred to be less than the diffusion length of the electrons in the p region. Also, the hole concentration level in the p region is preferred to be less than the electron concentration of the n+ region. The method may further include forming a metallic layer above the p region. The work function of the metallic layer is preferred to be less than the energy gap of the p region, and the thickness of the metallic layer is preferred to be of the order of or less than the mean free path for electron energy. The method may still further include forming a p+ region, for example, by delta doping the p region. The method may yet include forming n and p electrodes so that n+-p junction may be forward biased for operation. The method may yet further include forming an M electrode, with or without forming the p electrode, to control-the amount of current emitted from the current emitter.

The above disclosed embodiments may be capable of achieving certain aspects. For example, the electron emitter may produce high density of emitted electron current. Also, the lifetime of the emitter may be relatively high. Further, the emitter may be based on well-known wide-gap materials and fabrication methods there of and thus, little to no capital investment is required beyond that present in the current state-of-the-art. In addition, the detrimental effects of high vacuum field—cathode surface erosion, ion absorption at the emitter surface, etc.—may be avoided since the device does not require strong electric fields in vacuum region, which results in stable operation. Thus, stability and high current density may be combined in a single device. The absence of need to use high fields in vacuum region may significantly simplify packaging, which would not require a high vacuum.

In short, unlike the prior devices, at least some embodiments of the present invention allows for cold durable emitters with large emitted currents and large efficiency.

BRIEF DESCRIPTION OF THE DRAWINGS

Features of the present invention will become apparent to those skilled in the art from the following description with reference to the drawings, in which.

DETAILED DESCRIPTION

For simplicity and illustrative purposes, the principles of the present invention are described by referring mainly to exemplary embodiments thereof. In the following description, numerous specific details are set forth in order to provide a thorough understanding of the present invention. It will be apparent however, to one of ordinary skill in the art, that the present invention may be practiced without limitation to these specific details. In other instances, well known methods and structure have not been described in detail so as not to unnecessarily obscure the present invention.

Figure 1A:
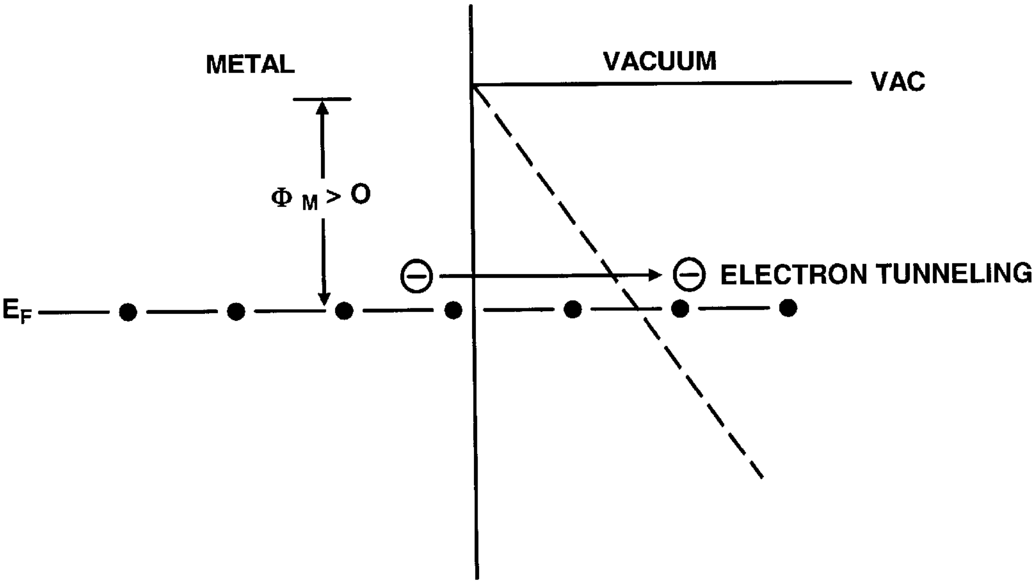
FIG 1A PRIOR ART
FIG. 1A is a graph of a typical energy diagram for a material surface illustrating a concept of a work function of the material.
Figure 1B:
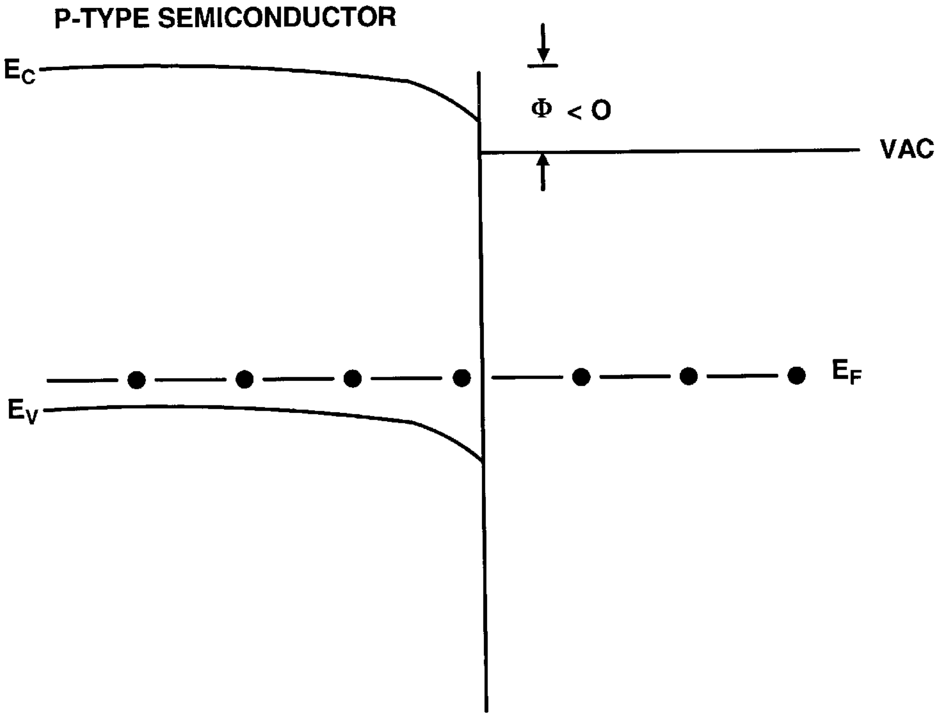
FIG 1B PRIOR ART
FIG. 1B is a graph of an energy diagram illustrating a concept of a negative electron affinity of a semiconductor material.
Figure 2A:
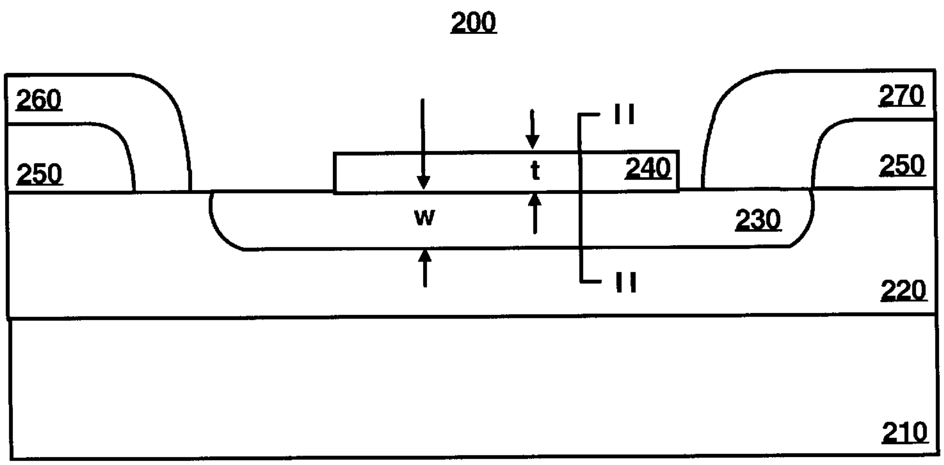
FIGS. 2A–2F illustrate exemplary cross sections of various embodiments of a cold emitter according to an aspect of the present invention.

FIG. 2A illustrates an exemplary cross section of a first embodiment of a cold emitter 200 according to an aspect of the present invention. The cold emitter 200 may generally be characterized as having an n+-p-M structure due to the presence of a n+ region 220, a p region 230, and a metallic layer 240. As shown in FIG. 2A, the cold emitter 200 may include a substrate 210 and the n+ region 220 formed above the substrate 210. The n+ region 220 may be formed from a wide band gap (WBG) semiconductor. Examples of WBG semiconductors include GaP, GaN, AlGaN, and carbon such as diamond, amorphous Si, AlN, BN, SiC, ZnO, InP, and the like. One of ordinary skill in the arts would recognize that other materials may be used as suitable WBG semiconductors. The electron concentration n, in the n+ region 220 is preferably above $10^{17}/cm^3$, optimally may be above $10^{19}$ $cm^{-3}$. However, depending on the types of applications, the concentration levels may be adjusted.

Indeed, the substrate 210 and the n+ region 220 may be formed from the same WBG semiconductor. The n+ region 220 may then be formed by doping the WBG semiconductor with electron rich materials. Examples of the electron rich materials include nitrogen (N), phosphorous (P), arsenic (As), and antimony (Sb). Again, one of ordinary skill in the arts would recognize that other electron rich materials may be used.

The cold emitter 200 may also include the p region 230 formed within or above the n+ region 220. The p region 230 may be formed, for example, by counter doping the n+ region 220 with electron poor materials. An example of such materials includes boron. One of ordinary skill will recognize that other electron poor materials may be used. The p region 230 may also be formed from entirely separate materials than the n+ region 220. It is preferred that the n+ region 220 be formed from a wider band gap material than the p region 230.

The hole concentration $p_p$ level in the p region 230 preferably ranges substantially between $10^{16}$–$10^{18}/cm^3$, with optimal concentration of about $10^{18}$ $cm^{-3}$. The range may vary depending on the type of applications. It is preferred that the hole concentration is less than the electron concentration in the n+ region, i.e. $p_p<n_n$. The ratio may be varied as well depending on the types of application. Also, W is preferred to be less than L, where W represents the thickness of the of the p region 230 as shown in FIG. 2A and where L represents diffusion length of the non-equilibrium electrons in the p region 230, also shown in FIG. 2A. The diffusion length L is typically 0.3 $\mu$m.

The cold emitter 200 may further include the metallic layer 240 formed above the p region 230. The metallic layer 240 may be formed from standard electrode materials like Au, Pt, W, and may also be formed from low work function materials. Examples of low work function materials include $LaB_6$, $CeB_6$, Au, Al, Gd, Eu, EuO, and alloys thereof. Preferably, the thickness t of the metallic layer 240 is on the order of or less than the mean free path $l_\epsilon$ for electron energy. Typically, $l_\epsilon$ ranges from 2–5 nanometers (nm). Thus, the thickness should be in the range t<2–5 nm.

Figure 3A:
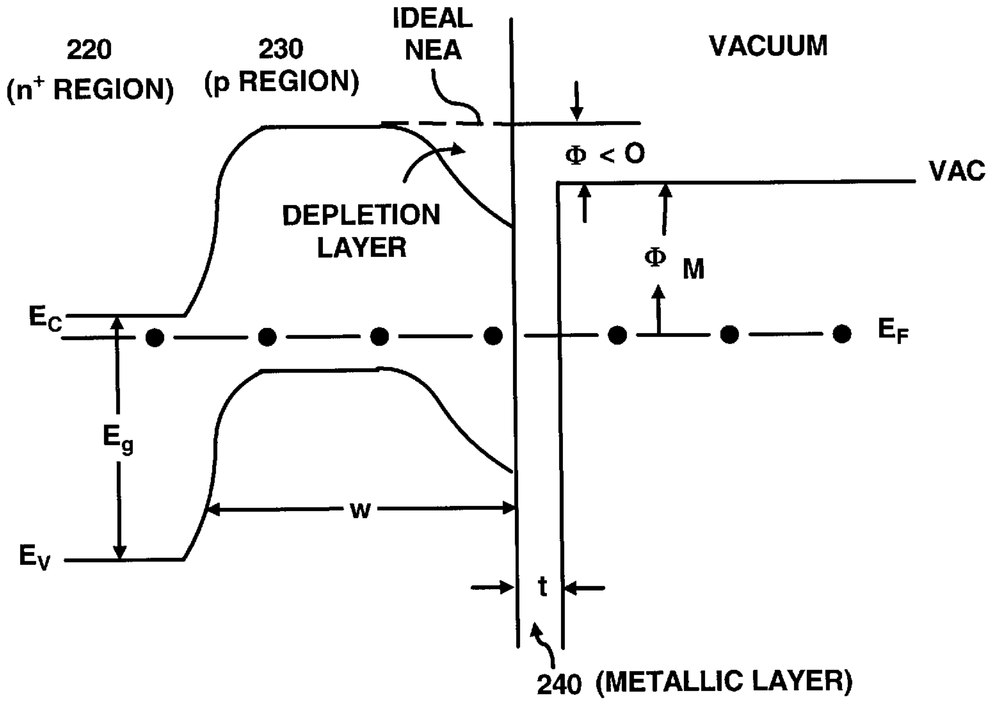
FIG. 3A illustrates an exemplary energy band diagram in equilibrium across the line II—II of the embodiment of the cold emitter shown in FIG. 2A.

The selection of the material for the metallic layer 240 depends on the $n^+$-p contact voltage difference between n+ region 220 and the p region 230. With reference to FIG. 3A, which illustrates an exemplary energy band diagram in equilibrium of the first embodiment of the cold emitter 200 of FIG. 2A, the criteria for the selection of the material for the metallic layer 240 is explained below. If the $n^+$-p contact voltage difference is represented as $V_{np}$, then the built-in potential in the junction may be represented $qV_{np} \approx E_g$ (see FIG. 3A) where q>0 represents the elementary charge and $E_g$ represents the energy gap between the conduction band energy $E_C$ and valence band energy $E_V$ of the p-region 230 as shown in FIG. 3A.

Preferably, the work function $\Phi_M$ of the metallic layer 240 is such that $\Phi_M < qV_{np} \approx E_g$. For example, the $E_g$ of diamond is about 5.47 eV. Thus, if diamond is used as the basis for the p region 230, then gold may be employed as the metallic layer 240 since the work function of gold $\Phi_M$ is 4.75 eV. Other materials have even lower $E_g$, such as $LaB_6$ and $CeB_6$ which have work functions that is substantially near 2.5 eV. One of ordinary skill would recognize that other materials maybe suitable as metallic layer 240, and the layer 240 may not be limited strictly to metals.

Referring back to FIG. 2A, the electron cold emitter 200 may still further include an n electrode 260 and a p electrode 270 formed above the n+ region 220. The n electrode 260 may be electrically connected to the n+ region 220 and the p electrode 270 may be electrically connected to the p region 230. The n and p electrodes, 260 and 270, may be formed from metal or other conductive materials. Examples of conductive materials include Au, Ag, Al, W, Pt, Ir, Pd, etc. and alloys thereof. In addition, the electron emitter 200 may include dielectric 250 to insulate the n and p electrodes, 260 and 270, respectively.

FIG. 3A illustrates an exemplary energy band diagram in equilibrium across the line across the line II—II of the first embodiment of the cold emitter 200 of FIG. 2A. As shown, left side of FIG. 3A corresponds to the bottom portion of the line II—II (n+ region 220) and the right side corresponds to the top portion (vacuum).

As noted above, it is preferred that the work function $\Phi_M$ of the metallic layer 240 be less than the energy gap of the p region 230, i.e. $E_g \approx qV_{np} > \Phi_M$. Under this condition, the energy level in the p region 230 junction exceeds the work function $\Phi_M$ of the metallic layer 240 as shown in FIG. 3A. Thus, the cold emitter 200 behaves as if it has the negative electron affinity, $\Phi<0$, since the energy of electrons in p region lies above the vacuum level Vac.

The operation of the cold emitter 200 will be described with reference to FIGS. 2A, 3A, and 4. At equilibrium, no electron emission takes place. This is because equilibrium electrons are absent in p-region and a depletion interfacial layer is formed at the p-M interface between the p region 230 and the metallic layer 240 as shown in FIG. 3A. Near the p-M interface, i.e. at the depletion interfacial layer, electrons lose energy and are not emitted from the metallic layer 240 into vacuum. This is due to the drop-off in the conduction band energy $E_C$ near the p-M interface, such that at the interface, the conduction band energy $E_C$ is below the energy level of vacuum Vac as shown in FIG. 3A.

Ideally, there would be no depletion interfacial layer, and this is shown by the dotted line near the p-M interface. Without the depletion interfacial layer at the p-M interface, the cold emitter 200 has the property of a NEA, meaning that the electrons injected into p region 230 would be emitted out of the cold emitter 200, since their energy in the p region 230 would be higher than the Vac.

The cold emitter 200 operates when the $n^+$-p junction at the interface between the n+ region 220 and the p region 230 is forward biased, i.e. there is a positive potential on the p region 230 with respect to the n+ region 220. The biasing potential may be applied via the n and p electrodes, 260 and 270, respectively. When the n+-p junction is forward biased, the electrons from the electron-rich n+ region 220 are injected into the p region 230. When the thickness W of the p region 230 is less than the diffusion length L of the non-equilibrium electrons in the p region 230, the electrons traverse the p region 230 and accumulate in the depletion interfacial layer.

This is an analogue of a transistor effect, in which the current through the base electrode (attached to p region 230) is determined by recombination rate of injected electrons with holes. The injected electrons accumulate in the depletion layer, where the hole concentration is very small, so that their recombination rate is very small. As a result, electrons accumulate in the depletion interfacial layer until their local quasi-Fermi level $E_F$ rises above the vacuum level Vac, as shown in FIG. 4. Consequently, the emission of the injected electron rapidly increases. In this instance, the emitted current is much larger than the recombination current in the base (similar to usual semiconductor transistor). This allows for very large currents to be emitted. The emitted electrons are accelerated by field in vacuum towards an anode electrode (not shown in figures).

Figure 2B:
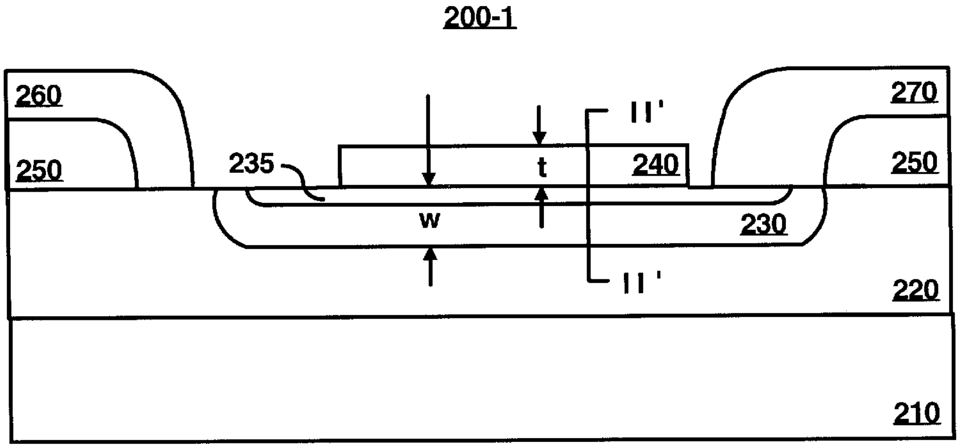

FIG. 2B illustrates an exemplary cross section of a second embodiment of a cold emitter 200-1 according to an aspect of the present invention. The cold emitter 200-1 may be described as a variation on the cold emitter 200 of FIG. 2A, and may generally be characterized as an n+-p-p+-M structure due to the presence of a p+ region 235 in between the p region 230 and the metallic layer 240. As shown in FIG. 2B, the cold emitter 200-1 includes all of the elements of the cold emitter 200 shown in FIG. 2A. For sake of simplicity, elements common to both cold emitters 200 and 200-1 will not be described in detail. It suffices to note that the behavior and the characterizations of the common elements may be similar.

The cold emitter 200-1, in addition to elements of the cold emitter 200, may also include the p+ region 235 formed within the p region 230. The highly doped p+ region 235, which may be very thin, may be formed by delta doping the p region 230 further with electron poor materials. The delta-doping produces a large concentration of a dopant in very thin layer. The hole concentration level in the p+ region 235 is preferably about $10^{20}$–$10^{21}/cm^3$, in a layer of thickness less than 100 nm. Also, the thickness W (this time of the p region 330 and the p+ region 335 combined) is preferred to be less than the diffusion length of the non-equilibrium electrons. Note that the p electrode 270 may be electrically contacting the p+ region 235 in addition to the p region 230.

Figure 3B:
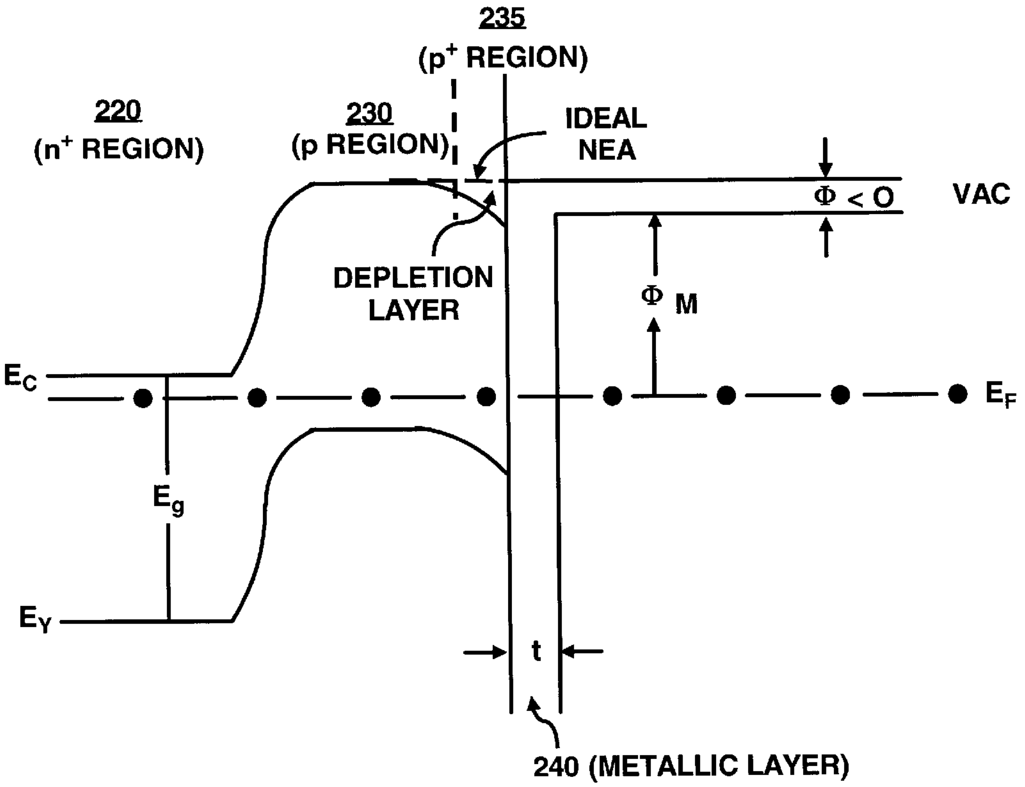
FIG. 3B illustrates an exemplary energy band diagram in equilibrium across the line across the line II'—II' of the embodiment of the cold emitter shown in FIG. 2B.

At least one role of the p+ region 235 is explained with reference to FIG. 3B, which illustrates an exemplary energy band diagram in equilibrium of the cold emitter 200-1 of FIG. 3A. It was discussed above that with regards to cold emitter 200 (first embodiment) as shown in FIG. 2A, a depletion interfacial layer forms at the p-M interface between the p region 230 and the metallic layer 240, and that near the p-M interface electrons lose energy.

The presence of the p+ region 235 decreases the band bending at the interface, and drives the emitter 200-1 closer to the ideal emitter with NEA. As shown in FIG. 3B, the drop-off in the conduction band level energy $E_C$ for the emitter 200-1 is smaller than the drop-off for the emitter 200 (compare with FIG. 3A). With the decreasing of the band bending, the quasi-local Fermi level for injected electrons, accumulated next to the $p^+$-M interface, moves closer to the ideal position, which improves the conditions for electron emission.

Figure 4:
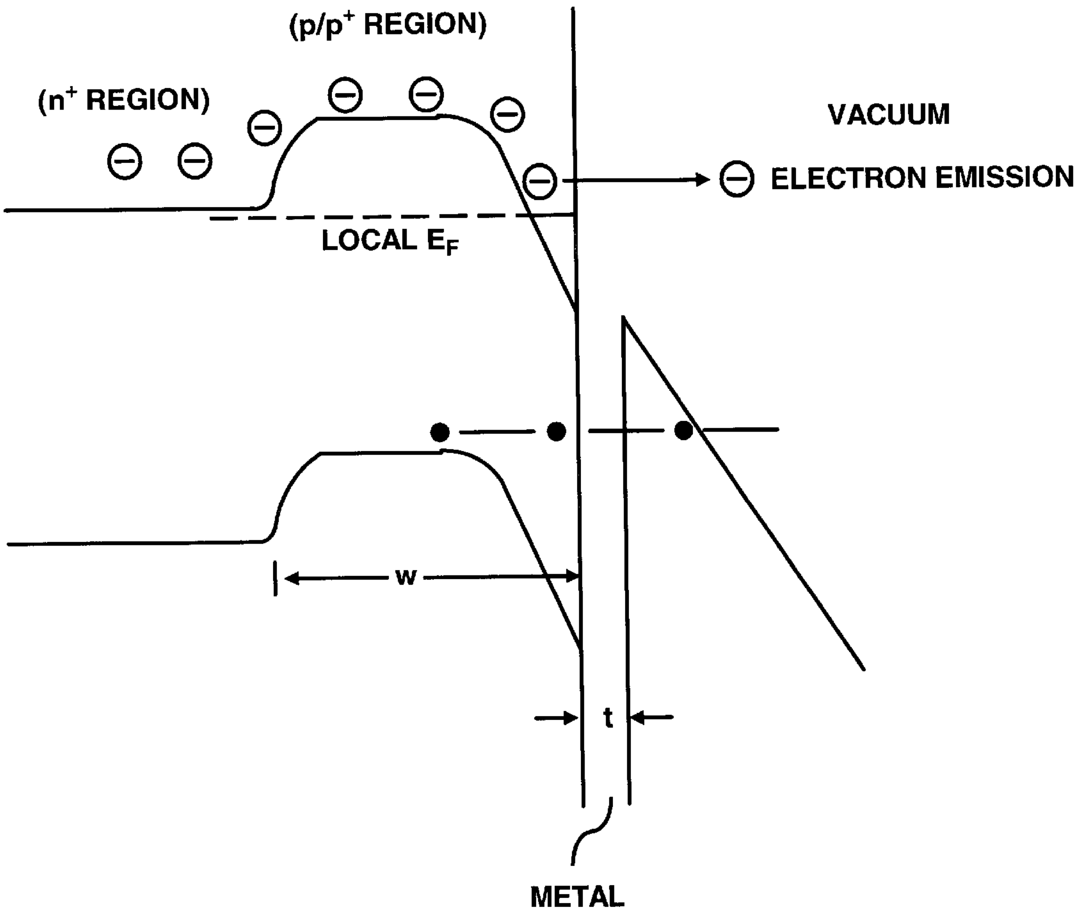
FIG. 4 illustrates an exemplary energy band diagram under bias of the cold emitters of FIGS. 2A–2F.

The operation of the cold emitter 200-1 is similar to the operation of the cold emitter 200 as shown in FIG. 4. In other words, the cold emitter 200-1 operates when the $n^+$-p junction at the interface between the n+ region 220 and the p region 230 (and the p+ region 235) is forward biased. In this instance, the less forward biasing is required due to the presence of the p+ region 235 and the corresponding lessening of the depletion interfacial layer at equilibrium.

Figure 2C:
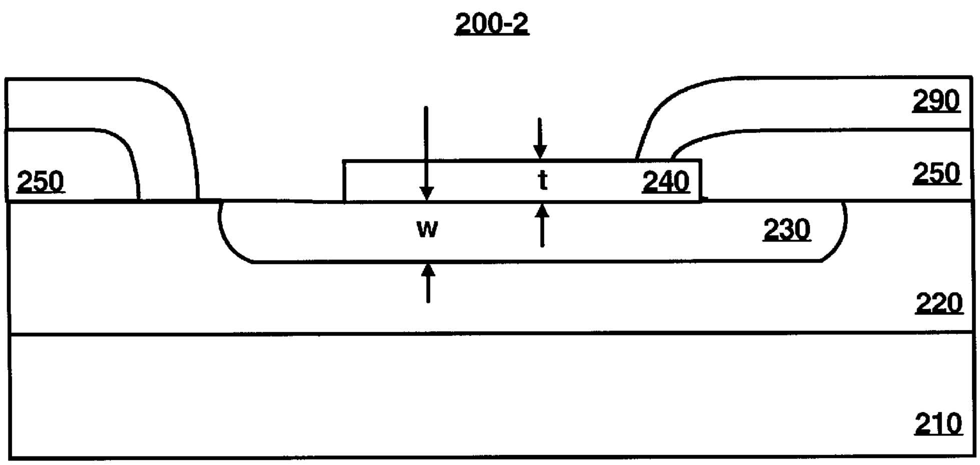

FIG. 2C illustrates an exemplary cross section of a third embodiment of a cold emitter 200-2 according to an aspect of the present invention. The cold emitter 200-2 may also be described as a variation on the cold emitter 200 of FIG. 2A, and may generally be characterized as an n+-p-M structure like the cold emitter 200.

As shown in FIG. 2C, the cold emitter 200-2 may include all of the elements of the cold emitter 200 shown in FIG. 2A, except that the cold emitter 200-2 may not include the p electrode 270, but may include an M electrode 290 formed above and electrically contacting the metallic layer 240. For sake of simplicity, elements common to both cold emitters 200 and 200-2 will not be described in detail. It suffices to note that the behavior and the characterizations of the common elements may be similar.

At least one role that the M electrode 290 may play is explained as follows. With regards to the cold emitter 200 (and 200-1), the emitters operate when the n+-p junction becomes forward biased. The biasing was provided through application of appropriate potential to the n and p electrodes, 260 and 270, respectively (see FIGS. 2A and 2B). With the cold emitter 200-2, the n+-p junction may become forward biased by applying appropriate potential to the n and M electrodes, 260 and 290, respectively. One of the advantages of the cold emitter 200-2 is that the device may be fabricated more easily when compared to the cold emitter 200 for example.

The operation of the cold emitter 200-2 is similar to the cold emitters 200 and 200-1 and need not be discussed in detail.

Figure 2D:
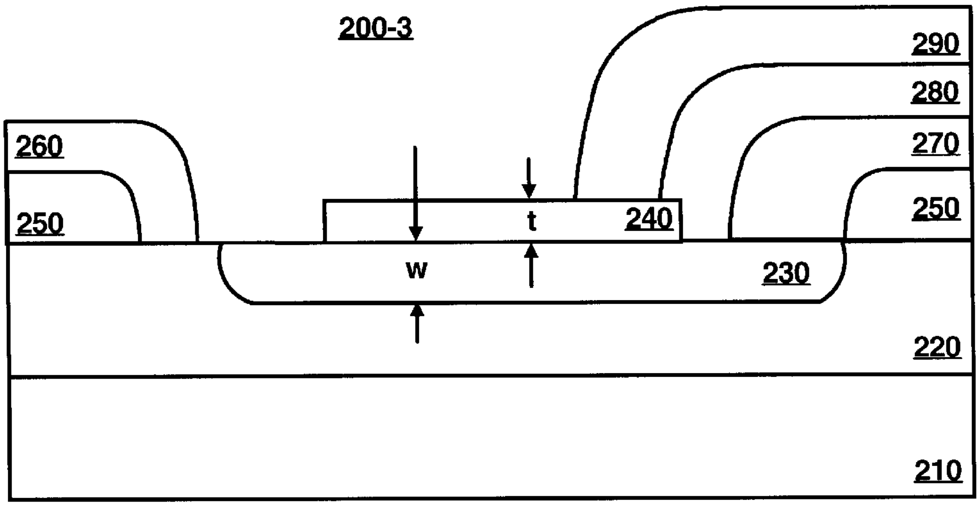

FIG. 2D illustrates an exemplary cross section of a fourth embodiment of a cold emitter 200-3 according to an aspect of the present invention. Like cold emitters 200-1 and 200-2, the cold emitter 200-3 may be described as a variation on the cold emitter 200 of FIG. 2A. The cold emitter 200-3 may generally be characterized as an n+-p-M structure. As shown in FIG. 2D, the cold emitter 200-3 includes all of the elements of the cold emitter 200 shown in FIG. 2A. For sake of simplicity, elements common to both cold emitters 200 and 200-3 will not be described in detail. It suffices to note that the behavior and the characterizations of the common elements may be similar.

The cold emitter 200-3, in addition to the elements of the cold emitter 200, includes an M electrode 290 formed above and electrically contacting the metallic layer 240 and a second insulating layer 280, which insulates the M electrode 290. In this instance, the forward biasing of the n+-p junction may be provided through applying potentials to the n and p electrodes, 260 and 270, respectively, as before with the cold emitter 200.

The general operation of the cold emitter 200-3 is similar to the cold emitters 200 and 200-1 and need not be discussed in detail. However, the M electrode 290 adds an additional controllability in the operation of the cold emitter 200-3. In this instance, the metallic layer 240 may be used to control the amount of emitter current. This is very advantageous in applications requiring arrays with individually controlled emitters. The emission current can be controlled by biasing the potential on metallic layer 240 through the M electrode 290. This closes and opens the emission current from the cold emitter 200-3.

The individual variations noted with the second, third, and fourth embodiments (cold emitters 200-1, 200-2, and 200-3, respectively) may be combined to reap the benefits of individual variations in one device. As examples, FIGS. 2E and 2F FIG. 2D illustrate exemplary cross sections of fifth and sixth embodiments of a cold emitter, 200-12 and 200-13 according to other aspects of the present invention.

Figure 2E:
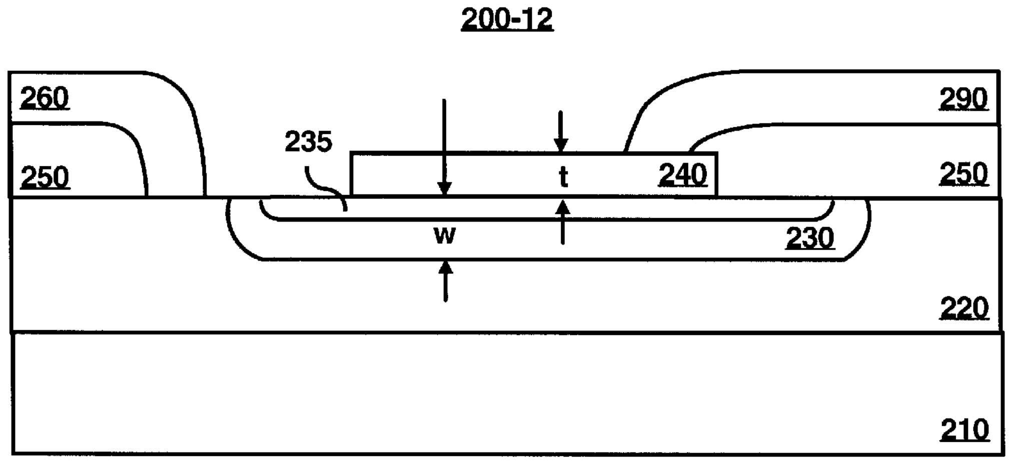

FIG. 2E illustrates an example of a combination of the cold emitters 200-1 and 200-2 (second and third embodiments, respectively). As shown, like the cold emitter 200-1, the cold emitter 200-12 includes a p+ region 235, and thus may be generally characterized as having an n+-p-p+-M structure. Also, like the cold emitter 200-2, the cold emitter 200-12 lacks the p electrode 270, but includes the M electrode 290.

The cold emitter 200-12 allows the potential to be applied to the p region 230 via the metallic layer 240. Also, due to the presence of the p+ region 235, relatively less forward biasing may be required.

Figure 2F:
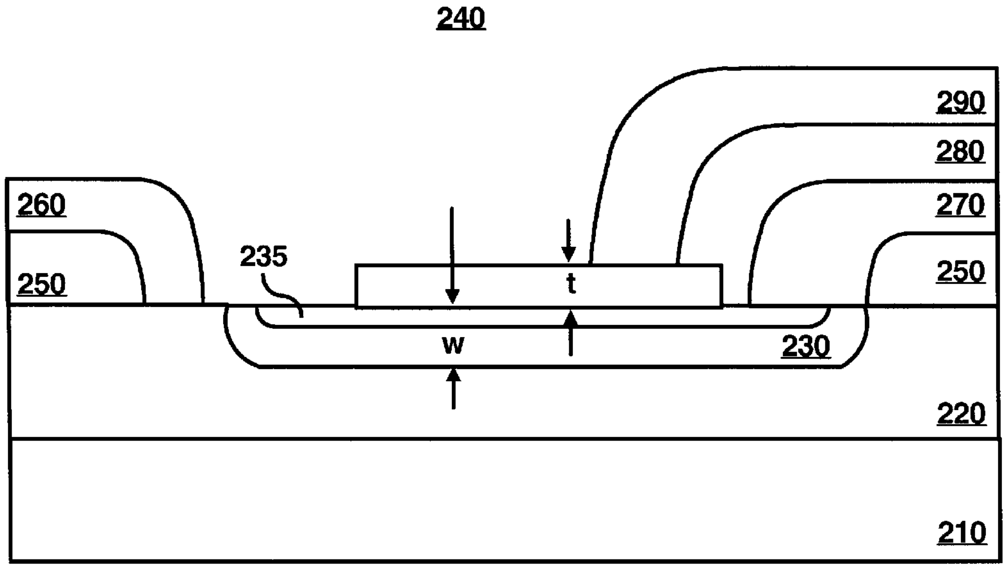

FIG. 2F illustrates an example of a combination of the cold emitters 200-1 and 200-3 (second and fourth embodiments, respectively). As shown, like the cold emitter 200-1, the cold emitter 200-12 includes a p+ region 235, and thus may be generally characterized as having an n+-p-p+-M structure. Also, like the cold emitter 200-3, the cold emitter 200-13 includes the M electrode 290 and the second insulator 280.

The cold emitter 200-13 allows the current amount to be controlled through appropriate biasing of the M electrode 290. Also, due to the presence of the p+ region 235, it is easier to fulfill the condition for NEA.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. An electron emitter, comprising:

an n+ region;

a p region formed within or above said n+ region; and a metallic layer formed above said p region, wherein a thickness of said metallic layer is substantially equal to or less than a mean free path for electron energy.

2. The electron emitter according to claim 1, further comprising:

a substrate below said n+ region.

3. The electron emitter according to claim 1, wherein said n+ region is formed from a wide band gap semiconductor.

4. The electron emitter according to claim 3, wherein said wide band gap semiconductor includes at least one of amorphous Si, GaP, GaN, AlGaN, diamond-like carbon, AlN, BN, SiC, ZnO, and InP.

5. The electron emitter according to claim 1, wherein an electron concentration level $n_n$ of said n+ region substantially ranges from $10^{17}/cm^3$ to $10^{19}/cm^3$.

6. The electron emitter according to claim 1, wherein an electron concentration level $n_n$ of said n+ region is greater than a hole concentration level $p_p$ of said p region.

7. The electron emitter according to claim 6, wherein said concentration level $p_p$ of said p region substantially ranges from $10^{16}/cm^3$ to $10^{18}/ cm^3$.

8. The electron emitter according to claim 1, wherein a thickness of said p region is less than a diffusion length of non-equilibrium electrons in said p region.

9. The electron emitter according to claim 1, where a vacuum energy level falls within an energy gap of semiconductor in said p region as formed in the device.

10. The electron emitter according to claim 1, wherein said metallic layer is formed from at least one of Au, Ag, Pt, W, Ir, Pd, $LaB_6$, $CeB_6$, Al, Gd, Eu, EuO, and alloys thereof.

11. The electron emitter according to claim 1, further comprising:

a p+ region formed within said p region and below said metallic layer.

12. The electron emitter according to claim 1, further comprising:

an n electrode formed above and making electrical contact with said n+ region.

13. The electron emitter according to claim 12, further comprising:

a p electrode formed above and making electrical contact with said p region.

14. The electron emitter according to claim 13, further comprising:

an M electrode formed above and making electrical contact with said metallic layer.

15. The electron emitter according to claim 12, further comprising:

an M electrode formed above and making electrical contact with said metallic layer.

16. The electron emitter according to claim 1, wherein said metallic layer substantially covers a center of said p region and is in direct contact with said p region.

17. An electron emitter, comprising:

an n+ region;

a p region formed as a well within said n+ region; and a metallic layer formed above said p region.

18. The electron emitter according to claim 17, wherein said n+ region is formed from a wide band gap semiconductor.

19. The electron emitter according to claim 18, further comprising:

a substrate below said n+ region.

20. The electron emitter according to claim 19, wherein said substrate is formed from said same wide band gap semiconductor as said n+ region.

21. The electron emitter according to claim 17, wherein an electron concentration level $n_n$ of said n+ region substantially ranges from $10^{17}/cm^3$ to $10^{19}/cm^3$.

22. The electron emitter according to claim 17, wherein an electron concentration level $n_n$ of said n+ region is greater than a hole concentration level $p_p$ of said p region.

23. The electron emitter according to claim 17, where a vacuum energy level falls within an energy gap of a semiconductor in said p region.

24. The electron emitter according to claim 17, wherein a thickness of said metallic layer is substantially equal to or less than a mean free path for electron energy.

25. The electron emitter according to claim 17, further comprising at least one of:

an n electrode formed above and making electrical contact with said n+ region;

a p electrode formed above and making electrical contact with said p region; and an M electrode formed above and making electrical contact with said metallic layer.

26. The electron emitter according to claim 17, further comprising:

a p+ region formed within said p region and below said metallic layer.

27. The electron emitter according to claim 17, wherein said metallic layer substantially covers a center of said p region and is in direct contact with said p region.

28. An electron emitter, comprising:

an n+ region;

an n electrode formed above and making electrical contact with said n+ region;

a p region formed above said n+ region or within said n+ region as a well;

a p electrode formed above and making electrical contact with said p region;

a metallic layer formed above said p region; and an M electrode formed above and making electrical contact with said metallic layer.

* * * * *